United States Patent [19]
Johnson

[11] 4,110,904
[45] Sep. 5, 1978

[54] SUBSTRATE WITH TERMINAL CONNECTIONS AND METHOD OF MAKING THE SAME

[75] Inventor: Samuel B. Johnson, Wauwatosa, Wis.

[73] Assignee: Allen-Bradley Company, Milwaukee, Wis.

[21] Appl. No.: 798,729

[22] Filed: May 19, 1977

[51] Int. Cl.² .............................................. H05K 1/10
[52] U.S. Cl. ..................... 29/628; 174/68.5; 339/220 R; 339/276 R; 339/17 R; 339/17 B
[58] Field of Search ............. 339/17 R, 220 R, 276 R; 174/68.5; 29/628

[56] References Cited
U.S. PATENT DOCUMENTS

| | | | |
|---|---|---|---|
| 3,268,652 | 8/1966 | Burns et al. | 174/68.5 |
| 3,281,923 | 11/1966 | Best et al. | 29/628 |
| 3,484,935 | 12/1969 | Burns | 174/68.5 |
| 3,517,437 | 6/1970 | Szobonya | 174/68.5 |

FOREIGN PATENT DOCUMENTS 1,324,639  7/1973  United Kingdom ................ 339/220 R

*Primary Examiner*—J. V. Truhe
*Assistant Examiner*—J. H. Bouchard
*Attorney, Agent, or Firm*—Arnold J. Ericsen

[57] ABSTRACT

An electrical circuit component includes an apertured substrate having a circuit deposited on a surface and further includes a terminal lead seated in the aperture and having laterally extending flanged portions in clamping relationship at opposite sides of the substrate. The inserted portion of the terminal lead is provided with peripheral knurling to define collapsible ridges. The ridges engage the surface of the aperture as a temporary means of aligning the axes of the terminal lead and the aperture prior to upsetting a protruding end portion of the lead for permanent clamping retention of the substrate and the deposited circuitry.

3 Claims, 6 Drawing Figures

SUBSTRATE WITH TERMINAL CONNECTIONS AND METHOD OF MAKING THE SAME

BACKGROUND OF THE INVENTION

This invention relates to the art of electrical circuit component manufacture and, more particularly, to improved means, including both the article and method for anchoring terminal leads or pins to a substrate and a circuit component supported by the substrate.

The increasing need for miniaturization of electrical components and the forming of electronic packages thereof, has called for a need for suitable substrates or bases upon which the components and circuits may be disposed. This in turn has required care in the selection of terminals and leads for mechanically interconnecting the components and circuits. It is often highly desirable to provide substrates of ceramic or glass or other frangible insulating materials for supporting the electrical circuitry. The circuitry may take the form of so-called "cermet" or thick film, or thin metallic or carbonaceous film materials disposed upon a substrate capable of being fired to join the film with the substrate.

Typically, terminal leads have been attached to a substrate to provide an electrical connection with a resistive or conductive film deposited on the substrate by means of soldering, mechanical crimping to the film and substrate with or without additional soldering, or by force fitting the lead into cavities formed in the substrate.

The field of the present invention is directed to attachment of leads, and particularly those of the pin type, to a substrate by swaging or other upsetting means directed to applying axial force to a lead member to provide laterally extending flange-like portions at the opposite ends of a through aperture in a substrate in combination with the resultant "bulging" of the portion of the lead member residing in the aperture to provide a secure anchor. Examples of prior art devices directed to this general method of attaching leads may be found in U.S. Pat. No. 3,257,708 granted to Alfred A. Stricker on June 28, 1966; U.S. Pat. No. 3,281,923 granted to Howard S. Best et al on Nov. 1, 1966; U.S. Pat. No. 3,659,245 granted to Robert L. Payne on Apr. 25, 1972 and U.S. Pat. No. 3,768,134 granted to Anthony F. Reda et al on Oct. 30, 1973.

Upsetting or swaging of terminal pins anchored in ceramic or glass based substrates have often resulted in a substantial "scrap rate" caused by substrate breakage during the terminal deformation operation. If the swaging force is too heavy, the substrate will crack; if the force is too light, the metal deformation will be incomplete and the connection will not function properly. Elaborate means of control have been provided in the past and, even then, there have been large quantities of nonrecoverable scrap made. In miniature electronic devices, the size of the substrate must be kept to a minimum — a requirement that limits the stress-bearing cross section of the substrate. Successful swaging therefore requires that the component parts be specifically designed for stress-bearing efficiency.

SUMMARY OF THE INVENTION

It is with the above problems and considerations in mind that the present improved component and method have evolved for securing a conductor or terminal pin to an electric circuit disposed on a substrate in a manner that will materially reduce the scrap rate and provide a component part design with certain design features that may be used to maximize stress-bearing efficiency.

It has been determined that swaging or upsetting procedures introduce conditions which develop crack-producing stresses in the substrate when pressures are distributed unevenly within the ceramic or glass based material surrounding the terminal aperture. A well designed substrate, for example, can successfully bear all the resulting swaging stress when such stresses are uniformly distributed; but if for some reason the stresses are concentrated to one side of the aperture, the same substrate will readily fracture. The effect is significant when one terminal is swaged alone, and is obviously compounded when two or more terminals are swaged simultaneously into a common substrate.

There is good reason to believe that crack-producing stress concentrations develop when the axis of the terminal pin or wire is not aligned with the axis of the hole at the very outset of the swaging operation. Co-axial alignment can be assured, and successful swaging enjoyed when the diameter of the terminal is made equal to the diameter of the hole. Obviously, from a practical standpoint, high volume production will rarely provide such idealistic arrangement. Since all component parts carry dimensional tolerances, a size-on-size design would lead to either dimensional interference in a portion of the devices and loose fits in the remainder of the components to be assembled.

The present invention provides for co-axial alignment without undue joining interference. The systematic alignment gained through the use of this invention produces uniform stress distribution, which in turn provides stress-bearing efficiency in the design of the substrate.

Essentially, the present invention provides simple knurled ridges raised on the surface of the terminal wire or pin along its inserted length. The maximum diameter of the wire, without regard to the raised knurl, is one that is less than the minimum diameter of the hole. The knurled splines or ridges are raised to a minimum diameter that exceeds the maximum diameter of the hole or aperture. Thus, when the knurled terminals or pins are inserted into the substrate apertures, the relatively fragile knurled splines or ridges, being of relatively equal size in section, will all be crushed an equal amount. This will generate a light, but positive interference fit and cause the mean axis of the terminal to align with the mean axis of the aperture. The quality of the resulting swaged connection will not be affected by the knurling feature.

DESCRIPTION OF THE PREFERRED EMBODIMENT OF THE INVENTION

Figure 1:
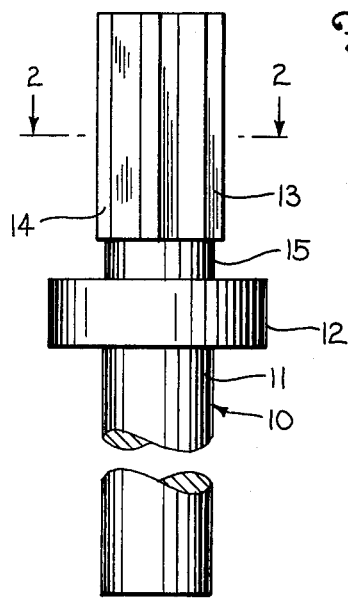
FIG. 1 is an elevational view of the terminal pin made in accordance with the present invention.
Figure 2:
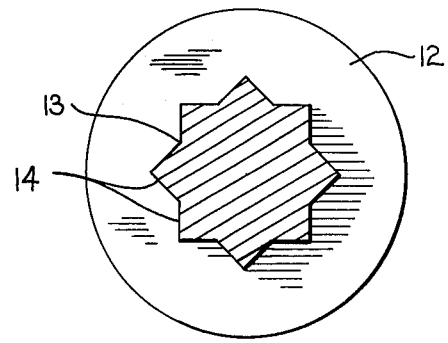
FIG. 2 is a cross-sectional view of the terminal pin taken along lines 2—2 of FIG. 1.

A pre-headed terminal pin, indicated generally by the reference numeral 10, is illustrated in FIGS. 1 and 2. It is to be noted that the various drawing figures are shown greatly enlarged for ease in explanation. Pin 10 has a terminating portion 11 arranged for electrical connection with printed circuit board conductors, or other means of electrically connecting with the pin (not shown). The pin 10 may be of a conventional 0.025 inch diameter copper wire precoated with tin for ease in making the electrical solder connection, or may be of any other suitable material commonly used in making terminal pins. The pin 10 is provided with a laterally extending flange 12 intermediate its ends. The pin 10 is further formed in accordance with the present invention to provide an insertion end portion 13.

It will be apparent from the views of FIGS. 1 and 2 that the insertion end portion 13 of the pin 10 may be knurled to provide a simple spline-like knurl as shown. The knurled ridges 14 extend radially from the surface of the pin 10 and are formed substantially coextensive with the length of the insertion end portion 13. A circumferential area 15 is left undisturbed during the knurling process, in order to avoid physical interference between the knurling tool and the flange 12. In order to provide a clear interpretation of the improved pin 10, and for sake of example only, a typical pin may have a terminating end 11 of approximately 1 inch with a pin diameter of 0.025 inches. The flange 12 may be 0.016 ± 0.003 inches thick and with a diameter of 0.050 ± 0.003 inches. The length of the insertion end portion 13, depending upon the thickness of the substrate to be later described, may be 0.054 ± 0.001 inches and with the undisturbed portion thereof being 0.010 ± .002 inches. After knurling, the insertion end portion 13 in its knurled area may have knurled ridges 14 measuring 0.028 ± .001 inches in a diametric direction and with the undisturbed area 15 being approximately 0.025 inches in diameter. It will be apparent that these dimensions have been given for purposes of illustration only, and that the present invention is not dependent upon any of the dimensions. In the present instance, the substrate, to be later described, is preferably 0.040 inches thick and this thickness along with the thicknesses of the conductive termination layer will determine the length of the insertion end portion 13.

Figure 3:
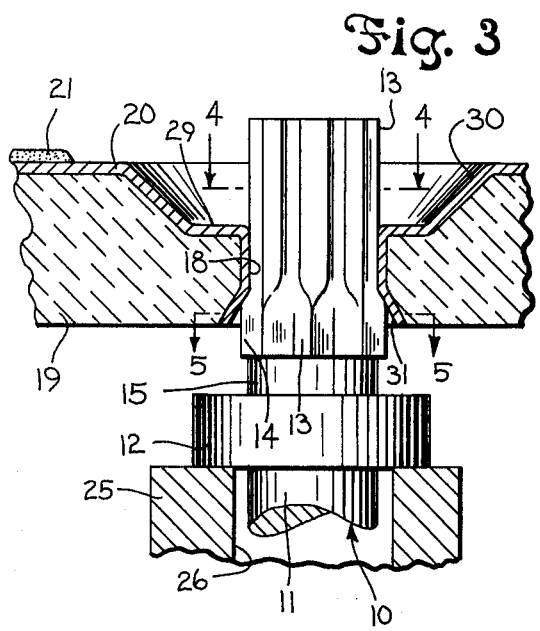
FIG. 3 is a fragmentary elevational view, partially in section, illustrating partial tooling supporting a flanged terminal pin and resistor assembly prior to full insertion and deformation of the inserted portion of the terminal pin.

FIG. 3 is illustrative of the first stage in the assembly of the terminal pin 10 into a respective aperture 18 of a substrate 19. The substrate includes a deposited conductive termination layer 20 which extends inwardly of the aperture 18 as shown. A resistive layer or other deposited electrical circuit component 21 is shown disposed in overlaid electrical connection with the termination layer 20. Preparation of these layers is well-known in the art, but for clarity in explanation, the substrate 19 may be of any suitable insulating material, such as alumina, steatite or like materials, whereas the termination layer 20 may be, for example, a fired-on silver layer applied by means of screen printing. The component layer 21, in the case of a resistor, may be of a so-called "cermet" composition including selected proportions of conducting materials supported in a fritted glass matrix. In the case of the cermet type devices, the substrate 19 with its deposited layers 20 and 21 are all prefired, in accordance with conventional practice, prior to insertion of the terminal pin 10.

Figure 4:
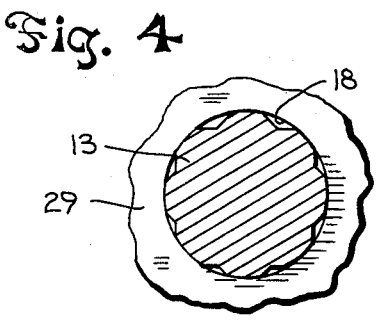
FIG. 4 is a partial cross-sectional view taken along lines 4—4 of FIG. 3 and illustrating the change in appearance of the collapsed knurled ridges of the terminal pin of FIGS. 1 and 2 after insertion into the aperture of the resistor assembly.
Figure 5:
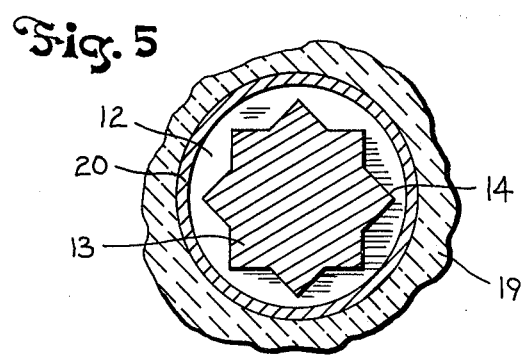
FIG. 5 is a partial cross-sectional view taken along lines 5—5 of FIG. 3 and illustrating the undisturbed knurled ridges of the terminal pin with respect to the chamfered entrance of the aperture after partial insertion of the terminal pin.

As shown in FIG. 3, the terminal pin 10 is temporarily disposed in a supporting fixture 25 having an aperture 26 for receiving the terminating end portion 11 with the flanged portion 12 resting on the top thereof. The substrate 19 is seated on the insertion end 13 of the pin 10 with the knurled ridges 14 engaging the aperture 18 of the substrate. As stated previously, the simple knurled ridges 14, raised on the surface of the terminal pin, provide a means for aligning the axis of the pin 10 with the axis of the aperture 18. Thus, the selected maximum diameter of the wire, without regard to the raised knurl, is one tht is less than the minimum diameter of the aperture 18. It will also be apparent that the knurled splines or ridges 14 extend the diameter of the pin portion 13 of the pin 10 so that it may exceed the maximum diameter of the aperture 18. The relatively frail, collapsible, knurled splines or ridges 14, being of relatively equal size in section, will tend to be crushed or collapsed in equal amount. This has been further illustrated in the cross-sectional view of FIG. 4. A light, but positive interference fit will be generated acting to cause the mean axis of the terminal to align with the mean axis of the aperture 18. It will be apparent from FIG. 5 that the ridges 14 remain undisturbed below the intermediate narrowed area of the aperture 18.

Figure 6:
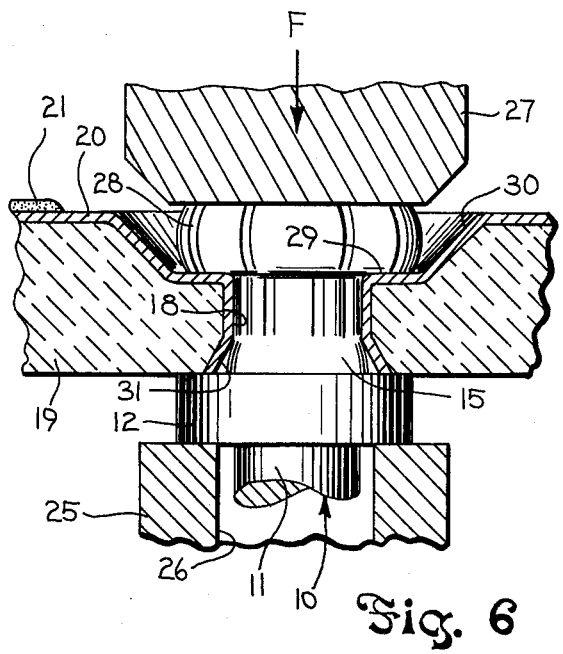
FIG. 6 is a fragmentary elevational view, partially in section, illustrating final deformation of the terminal pin.

After the pin 10 has been fully inserted so that the upper surface of the flange 12 abuts the bottom surface of the substrate 19, a force F is exerted against the distal end of the insertion portion 13 of the pin 10 by means of a reciprocating punch member 27 (see FIG. 6). Movement of the punch 27 towards the fixture 25 will cause the insertion end 13 to be swaged or upset to provide the upper flanged portion 28 which engages the surface 29 of the substrate 19. The upset insertion end portion 13 also tends to bulge laterally in the chamfered portions 30 and 31. It will be noted from FIG. 6 that the upper flanged portion 28 generally includes vestiges of the knurled ridges 14 and that these ridges further become distended in the portion of the pin 10 lying between the flanged portions 28 and 12.

It is to be noted that the chamfer 31 is principally provided as a guiding means for insertion of the end 13 of the pin 10 into the aperture 18 of the substrate 19. The upper chamfer 30 provides a means for receiving the swaged metal to provide a good clamping engagement with the substrate with a minimum height of metal of the terminal 10 being exposed over the top of the substrate 19.

Although a simple spline-type knurl has been indicated in the preferred embodiment, it will be apparent that any crushable or frangible knurled ridge capable of centering the terminal pin within the substrate aperture will operate satisfactorily.

For instance, the present invention contemplates knurled, laterally extending ridges, such as the straight longitudinally disposed, circumferentially spaced ridges of the present embodiment, as well as a conventional diamond knurl, octagon section, and laterally extending axially spaced collapsible collars, or ribs (not shown). The design is applicable to any malleable terminal material which, of necessity, would be required for the swaging process.

It will be apparent that the interference fit provided by the initial insertion of the terminal pin 10 into the aperture 18 of the substrate 19 (see FIG. 3) will provide a temporary means for retaining the pin with respect to the aperture in substantial co-axial alignment during the swaging operation. It has been found that pins of the prior art without the aligning means of the present invention tend to concentrate tensile and shear forces within the walls of the relatively thin substances, causing the substrates to break with consequent scrap loss. This is an increased problem when one considers that the substrate has already been partially completed by having deposited thereon layers of relatively precious metals, which after firing are virtually nonrecoverable. Scrap formed at early stages of production is relatively inexpensive when compared to scrap formed after fabrication is virtually completed. The saving of such scrap is an obvious goal and one which has been achieved by the present invention.

The embodiments of the invention in which an exclusive property or privilege is claimed are defined as follows:

1. A method of attaching a lead to an electrical circuit component deposited on an apertured fired ceramic substrate by a swaging operation, wherein the aperture extends through the substrate and said circuit component, said method comprising the steps of:
   providing a terminal lead having a first portion and a second portion;
   forming said first portion of said lead to provide a plurality of integral, laterally extending, collapsible ridges;
   inserting said first portion of said lead through said aperture so that the distal end of said portion extends beyond said substrate,
   the collapsible ridges of said first portion being dimensioned to provide a temporary holding force between said lead and the surface of said aperture, whereby the longitudinal axis of said lead and the central axes of said aperture will be maintained in substantial alignment prior to and while said lead is subjected to a final upsetting operation;
   said second portion being arranged for electrical connection to a source of electrical energy;
   applying a force to said lead along the longitudinal axis thereof to upset the extended distal end portion and to bulge the said first portion to distend this portion radially towards lateral engagement with the surface of said aperture.

2. The method of claim 1, wherein said lead is preheaded to provide a laterally extending flange portion intermediate the ends thereof and dividing said lead into said first and second portions, said flange portion being preformed on said pin and disposed adjacent the aperture bordering region of said substrate oppositely disposed from the said distal end portion.

3. The method of claim 1, wherein the said fist portion is knurled to form a plurality of circumferentially spaced, longitudinally arranged, laterally extending ridges around the periphery of said first portion.

* * * * *